United States Patent [19]

Millard

[11] 4,052,722
[45] Oct. 4, 1977

[54] TRAFFIC RADAR AND APPARATUS THEREFOR

[75] Inventor: Keith Millard, Decatur, Ill.

[73] Assignee: Decatur Electronics, Inc., Decatur, Ill.

[21] Appl. No.: 613,302

[22] Filed: Sept. 15, 1975

[51] Int. Cl.$^2$ .................... G01R 23/02; G01S 9/44
[52] U.S. Cl. .................................. 343/8; 324/79 R; 324/79 D; 343/5 AF
[58] Field of Search ............. 343/8, 5 AF; 324/79 R, 324/79 D

[56] References Cited

U.S. PATENT DOCUMENTS

| | | | |
|---|---|---|---|
| 2,558,758 | 7/1951 | Jaynes | 343/8 |
| 3,173,087 | 3/1965 | Loposer | 324/79 R |
| 3,380,050 | 4/1968 | Hileman | 343/8 |
| 3,721,977 | 3/1973 | Darboven | 343/8 X |
| 3,750,170 | 7/1973 | Brown | 343/8 |
| 3,754,253 | 8/1973 | Balsiger | 343/8 X |
| 3,886,461 | 5/1975 | Hassenchal et al. | 343/8 X |
| 3,893,076 | 7/1975 | Clifford | 343/8 X |
| 3,893,113 | 7/1975 | Iten et al. | 343/8 X |
| 3,936,824 | 2/1976 | Aker et al. | 343/8 |

Primary Examiner—Malcolm F. Hubler
Attorney, Agent, or Firm—Neuman, Williams, Anderson & Olson

[57] ABSTRACT

Apparatus is provided for determining the frequency of unknown periodic input signals and primarily generally sinusoidal signals which may be accompanied by very substantial noise. More particularly, the system for determining the frequency of unknown periodic input signals accompanied by substantial noise is adapted to a unique traffic radar or doppler radar system. The apparatus includes a phase locked loop in which the incoming signal accompanied by noise is compared with the output from a voltage controlled oscillator to generate a synthetic signal which is substantially free of noise and is well adapted for counting, measuring and display circuitry to give a direct indication of the input signal frequency or a parameter directly related to that input signal frequency. Specifically in doppler radar systems the direct readout is in "miles per hour", a direct function of doppler frequency. The signal which is being subjected to frequency determination is applied directly to the comparator portion of the phase locked loop circuit and it is also applied to the comparator portion of the phase locked loop circuit through a tunable band pass filter whereby speed of response is obtained without loss of noise rejection or frequency or harmonic range. Also an automatic frequency control loop is employed with the comparator to adjust the voltage control oscillator and this AFC loop has adjustable gain which is directly related to the frequency of the incoming signal to enhance the stability over the entire frequency range. The system is also capable of an instantaneous determination of locked operation whereby false readings are avoided.

18 Claims, 4 Drawing Figures

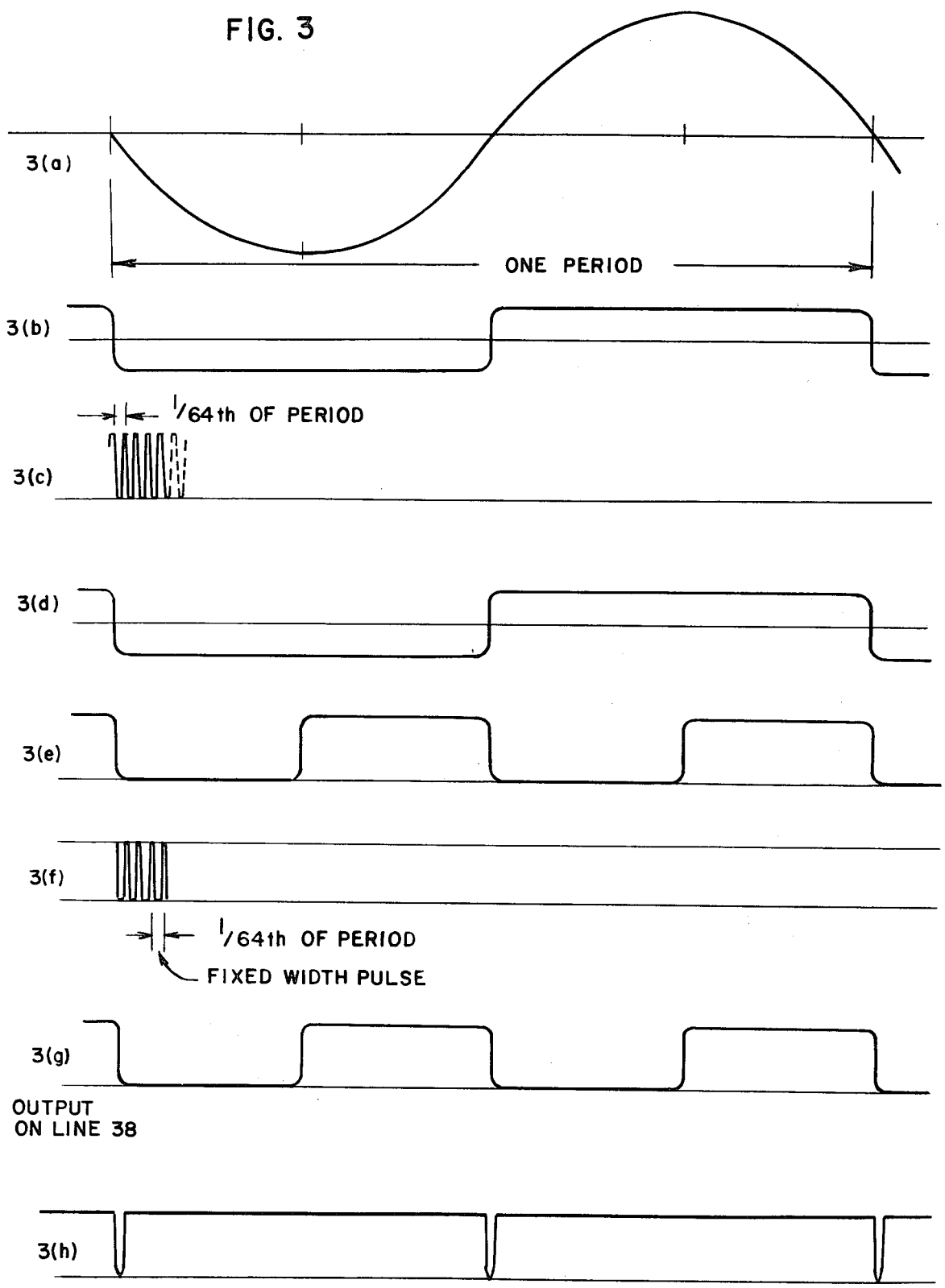

TRAFFIC RADAR AND APPARATUS THEREFOR

BACKGROUND OF THE INVENTION

Traffic and other doppler radar systems have been known for many years. The typical traffic radar employs a high-frequency source of electrical energy which is transmitted as a beam in the direction of a vehicle and the reflected signal from the vehicle is passed through a detector and duplexer which produces an output audio signal. This signal is equal to the frequency difference between the transmitted and received signal. This frequency difference is representative of the speed of the vehicle in accordance with the well-known doppler principle. Typical of the prior art doppler radar systems is that disclosed in U.S. Pat. No. 3,438,031.

The basic principle upon which a stationary CW doppler radar operates is set forth in the following well-known equation:

$$F_d = (2v/c) f_t$$

Where
  $F_d$ is the doppler frequency
  $f_t$ is the transmitted frequency
  $v$ is the target velocity
  $c$ is the speed of light
This equation assumes that the vehicle is headed on a radial path directly toward or away from the transmitter. A typical nominal transmitter frequency used in radar of this kind is $10.525 \times 10^9$ Hz and the doppler frequency $F_d$ in Hertz as a function of target velocity, $v$, in miles per hour is then:

$$F_d (Hz) = 31.389 \, v \, (mph)$$

Thus, for speeds from zero to 400 miles per hour, the doppler signal $F_d$ is within the audio range of roughly 0 to 12 kHz. Throughout this specification the $10.525 \times 10^9$ Hz transmitter frequency will be assumed in discussing speeds, time intervals, doppler frequency-speed analogs and the like.

Doppler radar systems of the type described herein generate an audio signal which is normally accompanied by substantial noise and spurious energy. Thus, the detection and measurement of the doppler signal is frequently difficult and subject to substantial error. The prior art radar has failed to fully solve the problem of noise and measurement accuracy with optimum sensitivity. Furthermore, the frequency range which must be covered is about 0 to 12 kHz and circuits capable of operating over this range have been generally complex and expensive with slow response times and poor noise immunity. The speed range under about five miles per hour, which, in the system described above, would have an analog frequency under about 157 Hz has been beyond the range of most known systems heretofore. For certain applications, such as railroad yard monitoring, it is desirable to measure speeds as low as 0.5 mph and measure doppler frequencies as low as 15 Hz.

SUMMARY OF THE INVENTION

The apparatus provided by this invention for determining the frequency of an unknown periodic input signal utilizes phase locked loop technology to provide enhanced noise immunity, freedom from harmonic ambiguity, excellent speed of response and an inexpensive method of accurately determining audio frequencies over a wide range for uses such as doppler radar equipment capable of measuring speeds under one mile per hour. The invention employs a unique combination including a band pass filter on the input to the comparator portion of the phase locked loop system in conjunction with a direct input which by-passes the filter whereby a wide range of frequencies, including a plurality of harmonics of the lower frequencies may readily be accomodated with speed and precision and with excellent noise rejection.

An automatic frequency control (AFC) circuit is employed in the phase lock loop (PLL) system to control the frequency of the voltage controlled oscillator (VCO) to augment the phase sensing portion of the system and thus accommodate a wide range of frequencies including multiple harmonics of the lower frequencies. The AFC loop employs adjustable non-linear gain features which provide enhanced stability over the wide frequency range to which the equipment is adapted. Furthermore, instantaneous sensing of locked operation of the system is provided by sensing any phase differences which exceed one-half cycle in width. Thus, whenever the signal to the voltage controlled oscillator (VCO) loses its locked characteristic, no more than one-half of a VCO cycle will pass before the loss of locked operation is indicated in the output of the verification circuit to prevent an erroneous indication in the display portion of the apparatus.

The foregoing system is combined in a doppler radar apparatus including signal verification, control of digital storage, data latching and readout in response to a combination of the variable signal information and verification information provided by the systems described above.

THE DRAWINGS

For a more complete understanding of this invention, reference will now be made to the accompanying drawings wherein:

FIG. 3 is a group of phase and signal diagrams on a common time base; and

FIG. 4 is a schematic time diagram of the timed pulses for determining the sampling interval for speed measurement.

THE DOPPLER RADAR

Figure 1:
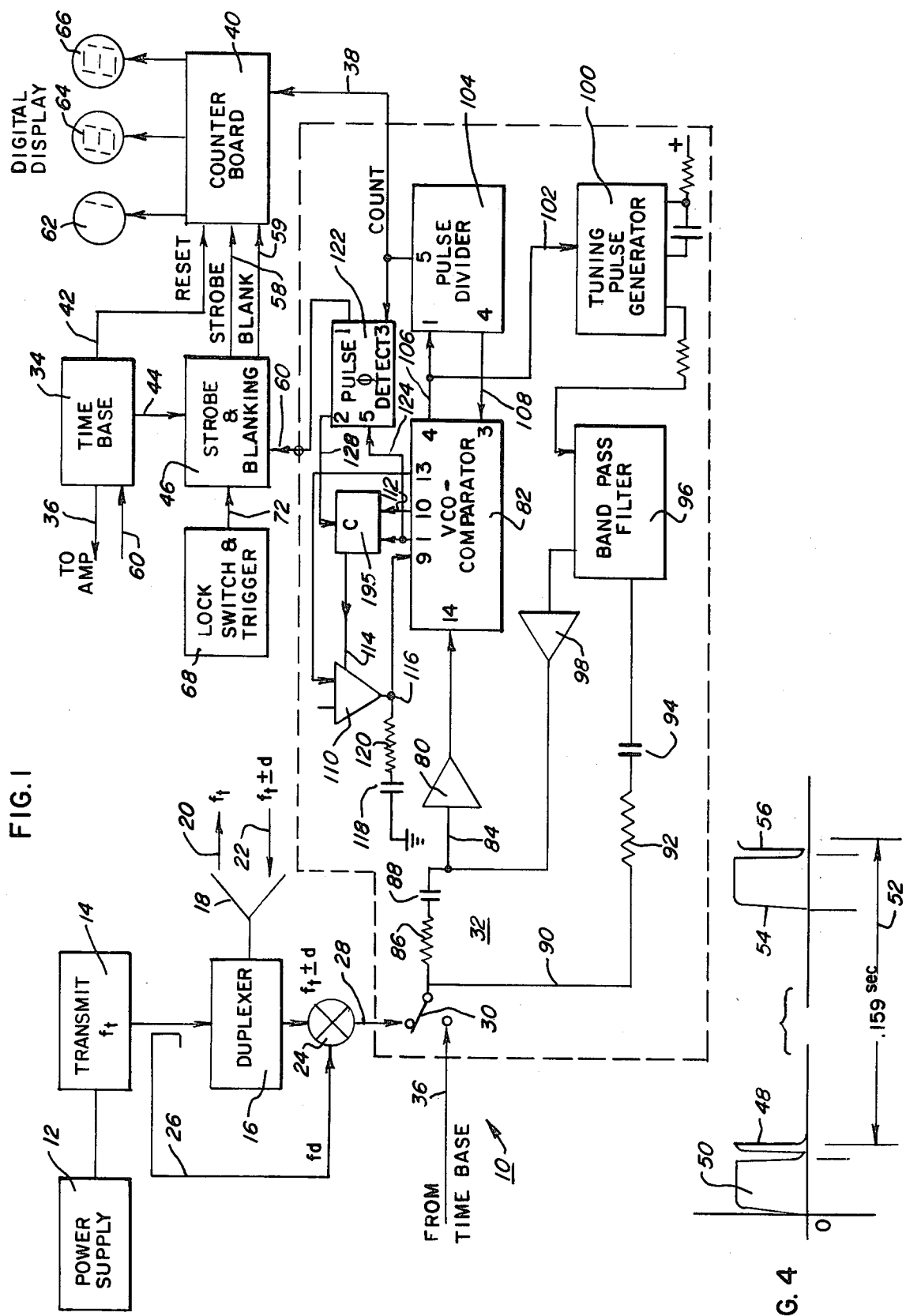
FIG. 1 is a block diagram of a doppler radar system incorporating the unique frequency determining and verification circuit of this invention.

Referring now to the drawings and more particularly to FIG. 1, a block diagram of a complete doppler radar with digital display is shown. The basic elements of such a doppler radar 10 comprise a power supply 12 which provides power for all of the circuits including a transmitter 14 which generates a constant wave (CW) signal in the microwave region, $f_t$. In the example described in detail the transmitter frequency is 10.525 gHz. The signal from transmitter 14 is applied through a duplexer 16 to an antenna 18 which transmits a finely focused collimated beam of energy indicated by the arrow 20. The energy is reflected off a target and returned to the antenna 18 and if the target is in motion toward or away from the antenna 18 the frequency of the reflected signal is $f_t \pm d$ as indicated adjacent arrow 22.

The reflected signal $f_t \pm d$ is received by antenna 18 and applied to duplexer 16 which in turn applies the signal to a mixer 24. The mixer 24 is also fed with a portion of the energy from transmitter 14 through the shunt coupler 26 and, by conventional mixing techniques well known in the art, the mixer 24 produces an output signal 28 having a frequency $d$. When the selector switch 30 is in the position shown doppler signal $d$ is applied directly to the input of the verification system 32 enclosed in broken lines. When the switch 30 is thrown to the lower position as illustrated in FIG. 1, the output of a standard frequency generator representing 60 mph contained within the time base system 34 is applied to the input of the verification system 32 through input 36.

Whether the switch 30 is in the upper position to receive the doppler signal through conductor 28 or in the lower position to receive the 60 mph standard frequency from conductor 36, the input to the verification system 32 is processed to generate at the output 38 a clean, relatively noise free frequency or series of pulses which represents the input frequency at the switch 30 and in the described embodiment is twice the input signal frequency. The details of this signal processing will be described in greater detail below.

The output signal on conductor 38 is applied to a counter board 40 containing an input circuit which divides the count by 10 to produce a signal having a frequency such that each count during a preset time base interval will represent one mph of vehicle speed. The output of the divide-by-10 circuit board 40 is fed to three serially connected decade counters in a conventional manner to store from 0 to 999 counts therein in binary form. This storage is accomplished in a completely conventional manner.

The divide-by-10 input circuit of counter board 40 as well as each of the three serially connected decade counters may be a conventional integrated circuit such as the TTL/MSI 7490 decade counter which includes conventional input, output and reset connections. The reset connection for a divide-by-10 and the three decade counters is energized from an output 42 of the time base circuit 34.

The time base circuit 34 contains a conventional 205.710 kHz crystal controlled oscillator and integrated circuits for dividing that frequency down to 6.277 Hz. The 6.277 Hz signal is applied to a monostable multivibrator such as a TTL/Monostable 74121 integrated circuit which with an appropriate capacitor produces an output pulse of 15 usec in response to each positive going edge of the output of the divider circuitry. This 15 usec pulse is the strobe pulse applied through conductor 44 to the strobe and blanking circuit 46 and through conductor 58 to counter 40 which will be described in greater detail below. The 15 usec strobe pulse is also applied to a second monostable multivibrator such as a 74121 with an appropriate capacitor to generate a second output pulse in response to the trailing edge or end of the strobe pulse. The second or reset pulse has a duration of 1.5 usec and is applied through the reset conductor 42 to the reset terminals of the divide-by-10 circuit and the three decade counters. Each time a reset pulse is applied from the time base circuit 34 through conductor 42 to the divide-by-10 circuit and decade counters, a new count is commenced in response to pulses applied to the counter board 40 through conductor 38 and the count continues until the next reset pulse arrives.

The time base circuit 34 also includes a 241.07 kHz crystal oscillator system and divider circuitry to produce an output on connection 36 having a frequency of 1,883.3 Hz in the particular embodiment described. From the doppler frequency-velocity relationship set forth above it will be immediately apparent that the output on conductor 30 of 1,883.3 Hz represents a vehicle travelling in the direction of or away from the antenna at a rate of 60 mph (31.389 × 60 = 1883.3). This is utilized to test the system.

The timing of the reset pulses is illustrated in the pulse diagram, FIG. 4, a first reset pulse 48 is illustrated following a first strobe pulse 50 with pulse amplitude plotted along the ordinate and time plotted along the abscissa beginning from the apex 0. The strobe pulse 50 is diagrammatically shown as having a 15 usec duration followed by a reset pulse 48 having 1.5 usec duration. The interval between pulses is the reciprocal of 6.277 Hz or 0.159 seconds as shown by the arrows and legend 52 on FIG. 4. A second strobe pulse 54 and a second reset pulse 56 are also illustrated.

The strobe and reset pulses would occur in the same sequence every 0.159 seconds whereby the count accumulated in the three digit counters contained in counter board 40 is equal to the number of cycles or pulses appearing on conductor 38 during the preceding 0.159 second interval divided by 10. As stated above, the various frequencies and time intervals referred to herein all relate to the preferred embodiment of the invention utilizing a 10.525 gHz transmitter frequency. Thus, in this embodiment the doppler difference frequency at conductor 28 equals 31.389 Hz for each mile per hour of vehicle velocity along a radial from the antenna. Therefore, the time interval of 0.159 seconds (6.277 Hz) for a count in the counter board 40 as shown in FIG. 4 contemplates 5 doppler cycles to be generated for every mile per hour of target velocity. However, the verification board 32 generates a synthetic count which is twice the input signal frequency and the counter board 40 includes an initial input circuit which divides the count on conductor 38 by 10 whereby each pulse applied to the three serial decade counters represents one mile per hour.

The use of a divide-by-10 stage prior to feeding the three decade counters eliminates any requirement to synchronize the time base generator 34. Thus, no synchronization between the sampling timing shown in FIG. 4 and the verification timing shown in FIG. 3 is necessary. The divide-by-10 circuit provides accuracy better than +0.2, −0.8 mph.

The three decade counters are connected in parallel to three latch circuits of a conventional type. A typical integrated latch circuit satisfactory for this purpose is the 4-bit latch TTL/MSI 7475. The transfer of the pulse count from the three decade counters to the three latches is controlled by the 15 usec strobe pulse applied through conductor 58 to the standard pins for clock input latches on the 7475. The strobe pulses such as pulses 50 and 54 shown in FIG. 4 are applied from the time base circuits 34 through conductor 44 to the strobe and blanking circuit 46. A verification signal from the verification board 32 is applied through conductor 60 to the strobe circuit 46 and also to the time base circuit 34 to control the transfer of the strobe pulses from conductor 44 to the output conductor 58 and in turn to the latches in control board 40 and to continuously reset the time base circuit 34 whenever there is no verified input signal.

The verification circuit 32 generates a control signal at the output 60 whenever a signal of adequate strength at conductor 28 is verified through the verification circuit 32 which will be described in greater detail below. When a signal has been verified the signal on conductor 60 permits the time base circuit 34 to initiate a measuring interval and the strobe pulse to transfer the count from the three decade counters to three parallel connected seven segment decoders such as integrated circuits 7447.

As indicated in FIG. 4, the strobe pulses 50 and 54 immediately precede the reset pulses 48 and 56. However, the strobe pulse cannot be transferred from the time base circuits 34 through conductor 44 to conductor 58 and the counter board 40 unless the signal from the verification board 32 through conductor 60 indicates that a verified reliable signal within the prescribed frequency range has been processed. In that event the strobe pulse causes the counts stored in the three decade counters to be transferred by the latch circuits and registered in the seven segment decoders forming the controls for the segment displays 62, 64 and 66. The seven segment decoders are standard TTL integrated circuits 7447 which control the seven segment display tubes such as tubes DR 2100. The operation and connections for the entire counter board are completely conventional and are also prescribed by the manufacturers of the components mentioned and thus not shown or described in greater detail.

The manual lock switch and trigger circuit 68 involves conventional solid state logic and provides an output 70 to control the passage of a verification signal as well as an output 72 to control the strobe and blanking circuit 46. The lock switch and trigger circuit has a manual control so that the operator of a traffic radar may at his option actuate a switch to lock and hold a reading on the digital display 62, 64 and 66 or blank the display completely. As will be described in greater detail below, this operation merely provides a signal on conductor 70 which disables the verification signal circuit contained in the verification board 32 so that a verification signal cannot be obtained on conductor 60 which would activate the strobe and blanking circuit 46 to permit subsequent readings to be displayed on the digital display. The blanking output 59 is also activated which is directly applied to a blanking input on each of the seven segments decoders to prevent a visual display.

Furthermore, the lock switch and trigger circuit 68 provides an output 72 to the strobe and blanking circuit so that unless the operator has actuated the appropriate control in the circuit 68 no readings will appear on the digital display 62, 64 and 66 or in the alternative he may hold a given display, such as a violation, for as long as he wishes until he actuates a switch to unlock the reset, strobe and display circuits.

VERIFICATION CIRCUIT

The verification circuit 32 of FIG. 1 performs the two functions of generating a relatively noise free and accurate pulse train which constitutes a doppler frequency count on output 38 when the system is used as a traffic radar and producing a verification signal to prevent erratic or spurious displays. As already discussed above, the test signal from the time base generator which appears on line 36 or the doppler frequency which occurs on line 28 is applied through switch 30 to a band pass filter circuit 96 with a parallel by-pass circuit to the PLL 82. The PLL includes a VCO which is intended for operation at 64 times the signal frequency and thus the VCO output is processed in the pulse divider 104, the outputs are used for PLL comparison, verification sensing and the output count on output 38.

The VCO output from PLL 82 is used directly to control the tuning pulse generator 100 which in turn tunes filter 96. The comparator outputs of PLL 82 are used to compare with the output of divider 104 in pulse phase detector 122 to generate a verification signal on output 60 and also a synchronization signal to a gate system 195. The latter provides additional charging current for the VCO control capacitor 118 for quick, large error response and control the variable signal to amplifier 110.

The VCO frequency is controlled by a D.C. input voltage on pin 9 of PLL 82. The control voltage for pin 9 is provided at the output of amplifier 110 and the polarity of changes in that voltage are determined by output 13 from the VCO portion of PLL 82. An automatic frequency control signal (which is approximately a buffered version of the input signal at pin 9 of PLL 82) is provided to amplifier 110 from output 10 of the VCO while a signal proportional to the magnitude of phase error is provided to amplifier 110 from VCO output 1 of PLL 82.

The phase locked loop circuit 82 includes a voltage controlled oscillator and comparator and in one embodiment is a single digital integrated circuit CD4046AE manufactured by RCA Corp. With that device the signal input is applied to pin 14, the variable DC voltage for controlling the voltage controlled oscillator is applied to pin 9 and the second comparator input for the phase locked loop 82 is applied at pin 3.

The input amplifier 80 has two signal sources applied to it through conductor 84. First there is a direct input from the switch 30 to input lead 84 through the high pass filter comprising resistor 86 and capacitor 88. The second input to amplifier 80 is through lead 90, resistor 92 and capacitor 94 which constitute a part of a tunable band pass filter 96 and an amplifier 98. The tunable band pass filter will be described in greater detail with respect to FIG. 2. However, the filter is in the nature of a wien bridge tuned by gating techniques controlled by a tuning pulse generator 100 which constitutes a monostable multivibrator. The multivibrator may be a 74121 manufactured by Fairchild, RCA and others which produces a series of constant duration tuning pulses at the VCO rate to the band pass filter 96 which are effectively integrated to control the center frequency of the band pass filter 96 as a function of the frequency of the VCO signal fed to the tuning pulse generator 100 over path 102. The band pass filter 96 in the embodiment described is capable of adjustment whereby the center frequency may be in the range of about 15 Hz to about 6000 Hz, which is adequate to cover a wider range of frequencies and consequently a wider range of vehicle speeds than was heretofore considered practicable or feasible. The filter has a Q of at least about 15 and preferably 20 or more whereby the by-pass of input signal from switch 30 through resistor 86 and capacitor 88 insures searching for the signal frequency in the PLL, the high input level through the filter 96 provides excellent noise immunity and stability once the approximate signal frequency is found.

For illustrative purposes FIG. 3 illustrates the approximate wave shapes at various points in the circuit of FIG. 1. The input wave shape on switch 30 is generally sinusoidal as shown by curve 3(a) while the gain and pulse shaping characteristics of amplifier 80 produce an input to the phase locked loop 82 which is generally a square wave at the input frequency as shown by curve 3(b).

For optimum operation of the voltage controlled oscillator which forms a part of phase locked loop 82, the oscillator operates at 64 times the input frequency at pin 14 of PLL 82 and thus the output of the oscillator which appears at pin 4 of PLL 82 is 64 times the input frequency of pin 14 when the phase locked loop is in a locked condition. The output at pin 4 of PLL 82 is applied to a conventional pulse divider circuit which may, for example, by an RCA CD4024 seven-stage binary counter. If that device is used as the pulse divider, pin 4 of PLL 82, the VCO output, is applied to pin 1 of divider 104 and it is divided down by the counter by a factor of 32 to produce a synthetic signal at lead 38 (pin 5 of the 4024) which has a period of one-half the period of the input signal at pin 14 of PLL 82 or, in other words, a frequency twice that of the input signal when the system is in locked operation. A second output from the CD4024 (at pin 4) provides a pulse division of 64 so that the output appearing on lead 108 and applied to the input 3 of PLL 82 is equal to 1/64th of the VCO frequency appearing on lead 106. The signal on lead 106 is diagrammatically shown as curve 3(c) in FIG. 3 and the output of divider 104 appearing at lead 108 of FIG. 1 is diagrammatically shown as curve 3(d) of FIG. 3. The output at pin 5 of the 4024 divider is shown as curve 3(e).

In a manner well understood in the art, the comparator portion of PLL 82 compares the positive going edge of the signal on input pin 14 with the positive going edge of the input at pin 3 and produces a phase comparator output at pin 13 which has three possible stages relative to the center voltage of the system. The output from pin 13 to operational amplifier 110 is a high voltage to produce increased charging current from amplifier 110 to charge VCO control capacitor 118 and thus raise the VCO frequency, or a relatively low voltage which produces less current and lower VCO frequency, or a zero output indicating phase coincidence and no required change in the current to capacitor 118.

The comparator also produces an output signal at pin 1 of PLL 82 which comprises a signal comprising pulses which correspond in length or duration to the time interval between the leading edges of the pulses on inputs 14 and 3 of PLL 82. This signal thus does not indicate whether the VCO frequency is too high or too low. If the PLL 82 is locked in with the VCO at the signal frequency, then the signal on pin 13 is "0" and no current is flowing to or from the amplifier 110 which is energized therefrom. In this steady state condition the phase pulse output at pin 1 of PLL 82 is high. At any time that the output at terminal 13 of PLL 82 is sourcing or sinking current, that is providing current to amplifier 110 or drawing current from the input of amplifier 110, the phase pulse output at terminal 1 of PLL 82 is a zero or at ground potential. The PLL 82 has one additional output at pin 10 which is a variable voltage corresponding to the input signal on pin 9 of PLL 82 but passed through a source follower or buffer. This signal from pin 10 is applied through conductor 112 to switch system 195 and through 114 to the operational amplifier 110 to produce a signal proportional to VCO frequency. In the described embodiment this amplifier 110 is an RCA CA3080 and conductor 114 is applied to amplifier bias input, which is pin 5.

In a manner which will be described below, the outputs from PLL 82 are applied to operational amplifier 110 to generate a VCO voltage at point 116 which is in turn applied to pin 9 of PLL 82 to control the frequency of operation of the voltage controlled oscillator. The voltage at point 116 is generated by current flowing from operational amplifier 110 and charging the integrating capacitor 118 through the series resistor 120. When the PLL 82 is locked, this voltage at point 116 remains relatively constant with the small current above or below the reference necessary for maintaining the control signal on the oscillator coming through amplifier 110.

The verification circuit 32 has an additional pulse phase detector circuit generally indicated by block 122. This pulse phase detector 122 may be a D type flip-flop circuit and in the described embodiment was one-half of the dual D type flip-flop circuit CO4013. The output count at pin 5 of pulse divider 104 is applied to the clock pin 3 of the D type flip-flop and the phase pulses from pin 1 of PLL 82 are applied through conductor 124 to the D input, pin 5, of the flip-flop 122. With this arrangement whenever the phasic relationship of the synthetic signal of the VCO and the input signal at pin 14 is such that the phase pulse output at pin 1 of PLL 82 has a "1" or high output more than fifty percent of the time, the pulse phase detector 122 will produce a true or positive signal at output pin 1 and this will be applied through conductor 60 to the strobe and blanking circuit 46 and time base circuit 34 so that the counter board will begin to accumulate a pulse count for a speed indication.

However, at any time that the phase relationship between the signals on lines 124 and 126 are out of phase such that pin 1 of PLL 82 is "0" or low half the time, then the pulse phase detector 122 will generate a zero output at pin 1, resetting the time base circuit 34 and preventing an erroneous digital display by blocking the strobe and blanking circuit 46.

In addition to the Q output at pin 1 of the D type flip-flop 122 a $\overline{Q}$ output at pin 2 is applied through conductor 128 to switch 195 and then through conductor 114 to the operational amplifier 110. Thus, when the VCO is out of phase with respect to the input so that pin 1 of PLL is low for more than ± 90° then current is provided to the operational amplifier 110 in a manner to be described with reference to FIG. 2 to increase the output current of amplifier 110, thus charging capacitor 118 at a more rapid rate and re-establishing phase coincidence between the input and oscillator signals more rapidly.

By this technique, signal acquisition is accelerated without sacrificing the stability of the system when the PLL 82 is locked in on the signal frequency. Furthermore, the pulse phase detector 122 is able to virtually instantaneously detect a noncoincidence between the input and oscillator signals and thus reset the time base circuit 34 and prevent the strobe and blanking circuit 46 from permitting erroneous digital displays.

Figure 2:
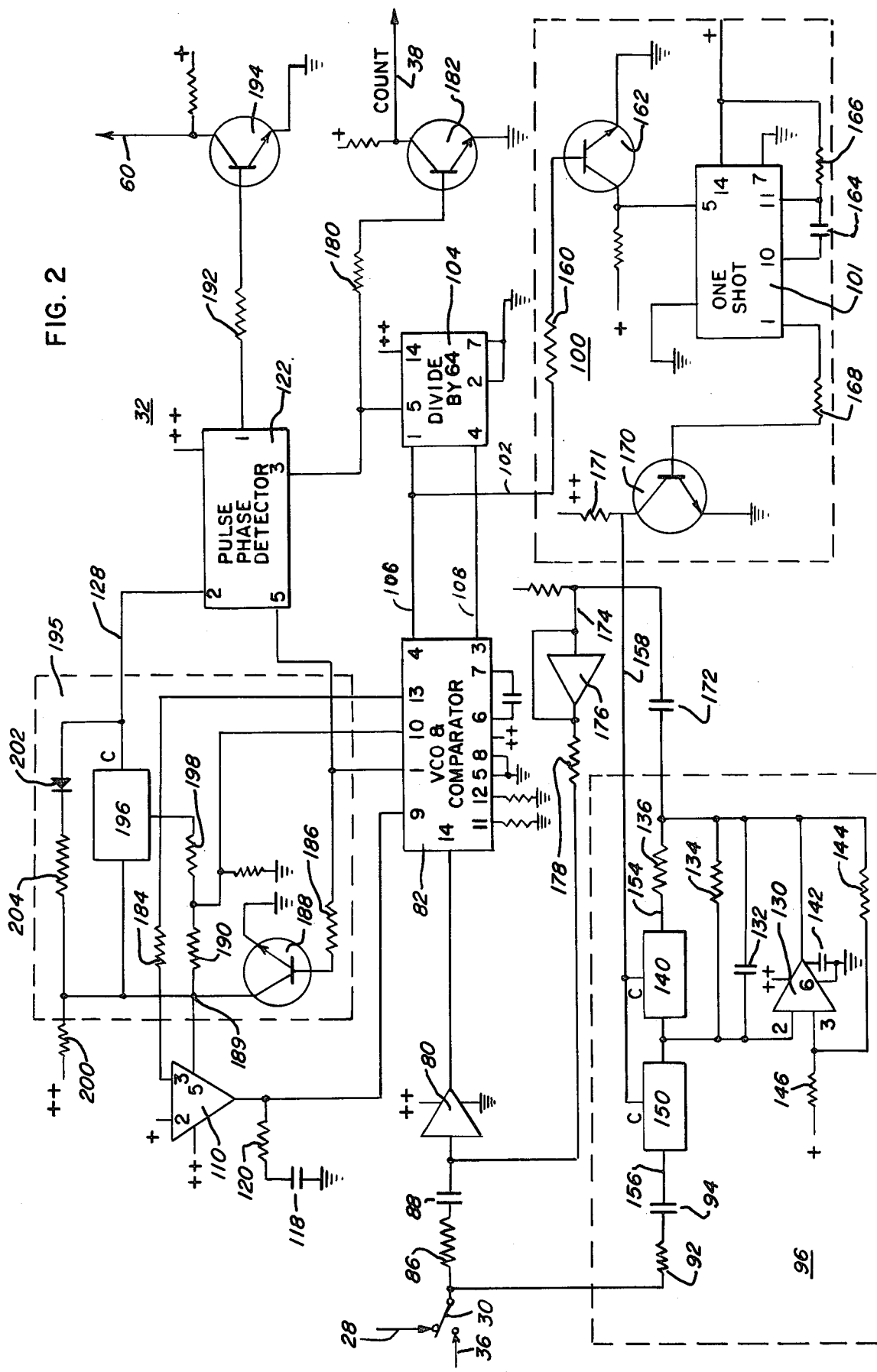
FIG. 2 is a circuit diagram of the phase locked loop and related verification circuitry of this invention.

The foregoing can be more fully understood from a detailed consideration of the circuit as shown in FIG. 2.

VERIFICATION CIRCUIT — FIG. 2

Referring now more specifically to FIG. 2, the verification circuit 32 of FIG. 1 is shown in more complete detail with the reference numerals of FIG. 1 being used where applicable. The time base input 36 and the input signal 28 are shown applied to switch 30 and in turn to the amplifier 80 through the high pass filter comprising resistor 86 and capacitor 88. This direct coupling provides a signal input to the PLL 82 even though the oscillator portion thereof is at a frequency widely divergent from the signal frequency and thus the tunable band pass filter 96 is preventing any significant energy from reaching the amplifier 80.

The band pass filter 96 is energized through the resistor 92 and capacitor 94 and comprises a gated operational amplifier 130 functioning like a wien bridge. Operational amplifier 130 is, in the described embodiment, an LM 308 and with hook up shown has a band pass characteristic which is determined in part by the feedback network comprising capacitor 132, by-pass resistor 134, auxillary by-pass resistor 136 and gate 140 which controls the effect of auxillary by-pass resistor 136. This combination provides the parallel RC leg of a conventional wien bridge. The effective value of resistor 136 is determined by the duty cycle of switch 140. Resistor 92, with capacitor 94 comprise the series RC leg of the wien bridge and the duty cycle of switch 150 determines its effective value. Capacitor 142 is for amplifier compensation and resistor 146 is selected to have a slightly smaller resistance value than resistor 144 to insure proper amplifier bias. Gates 140 and 150 provide a periodically controllable low impedance shunt between the conductor 152 and the conductors 154 and 156, respectively. Gates 140, 150 and 196 may conveniently be part of a single IC such as a quad bilateral switch 4016. The gates 140 and 150 are both controlled at their "C" inputs through conductor 158 from the one-shot multivibrator 101 comprising the principal element of tuning pulse generator 100. The one-shot multivibrator 101 which in the described embodiment is an integrated circuit 74121 receives pulses through resistor 160 from the VCO output at pin 14 of the PLL 82. These pulses are applied to a pulse shaping transistor switch 162 whereby these pulses turn on and off transistor 162 and thus ground and unground the B input at pin 5 of the one-shot multivibrator 100 initiating a multivibrator cycle on the leading edge of the unground phase.

The capacitor 164 in conjunction with resistor 166 determine the length of the pulse generated by the one-shot multivibrator and the time constant of this RC network is sufficiently short so that substantially the entire pulse is available at transistor 170 over the entire frequency range of the radar, that is approximately 15 to 6000 Hz. The periodicity of the one-shot multivibrator is of course controlled by the output of the VCO and thus varies in a generally direct proportion to the frequency of the synthetic signal. The nature of this pulse is diagrammatically shown as curve 3(f) of FIG. 3.

The pulses are applied to transistor 170 to turn it off during a predetermined portion of each sensed synthetic signal and this provides a high level connection through resistor 171 and connection 158 to momentarily enable the gates 140 and 150.

As a consequence of the control provided by the tuning pulse generator 100 and gates 150 and 140, a rising VCO oscillator frequency will cause the center frequency of the tunable band pass filter 96 to rise correspondingly. In the preferred embodiment the resistor 134 is 10 Meg ohms while the shunting resistor 136 is only 10 K ohms. Thus the resistor 134 is effective only at the low frequency end of the range where the time-averaged value of resistor 136 is of the same order of magnitude. Thus as the gate 140 remains open for increasing periods of time, there is an effective resistance increase of the series and shunt resistors and thus the center frequency of the wien bridge goes down. This technique provides a high Q variable center frequency filter having an output applied to capacitor 172 and in turn through conductor 174 to amplifier 176. In the preferred embodiment resistor 146 is 39 K ohms, resistor 144 is about 20 K ohms which is the desired ratio for wien bridge operation. Amplifier 176 in turn has its output connected through resistor 178 to the input of amplifier 80.

The operation of the PLL 82 has already been described in considerable detail above. The signal input at terminal 14 is compared with the VCO divided by 64 input at terminal 3 to generate output control signals. These are at terminals 1, 10 and 13 when utilizing the RCA phase locked loop CD4046AE. The voltage controlled oscillator is controlled by a variable input level at pin 9 to produce a VCO output frequency at pin 4 which, when the system is locked, is precisely 64 times the input frequency at pin 14. The pulse divider 104 also provides an output at pin 5 which is 1/32nd of the frequency of the VCO and this is applied through resistor 180 to a transistor switch 182 which provides a relatively noise free synthetic pulse train at output 38. This pulse train is a direct representation of two times the signal frequency at input 28 from the doppler detector 24. The pulse divider 104 provides one additional division of the oscillator output to produce a division by 64 and this is applied from pin 4 of divider 104 to the comparator input 3 of PLL 82. The comparator provides a three level output at pin 13 which is applied through resistor 184 to the input pin 3 of the operational transconductance amplifier 110. The output of amplifier 110 represents the differential input between the input to terminal 2 and the input to terminal 3, but this is merely switched to determine whether the output will be +, −, or zero. The preferred embodiment utilizes a conventional two level power supply and in the drawings the symbol + signifies a 5 volt level, often the reference level, while + + signifies the full 10 volt supply. When the PLL 82 is locked, a plus or minus voltage offset from the + reference is applied from pin 13 of PLL 82 to pin 3 of amplifier 110 to turn on the push-pull amplifier to produce an output of corresponding polarity. The amount of current is determined by the input to bias pin 5 of the amplifier. The time that the output at pin 1 of PLL 82 is low then determines the maintenance of a predetermined charge on the VCO control capacitor 118 through resistor 120. This control voltage is applied to control pin 9 of the VCO which forms a part of the PLL 82.

Any time output 13 is either positive or negative, that is it is either sinking or sourcing current to the operational amplifier 110, pin 1 is indicating a zero or ground and thus signal from data pin 10 of PLL 82 and from the detector 122 can be utilized. Any time pin 13 is in its high impedance state indicating that the VCO and input signal are in phase, the output pin 1 goes to a 1 or high state, point 189 goes to ground, and amplifier 110 has no output. This signal from pin 1 of PLL 82 is applied through a resistor 186 to transistor switch 188, effectively grounding pin 5 of operational amplifier 110 preventing any output from amplifier 110 while there are no output pulses from pin 13 to determine the polarity of the output current from 110.

The output of pin 10 of PLL 82 is a sense output from the VCO and is proportional to the control voltage applied to the VCO at pin 9 but buffered. The higher this voltage is the higher the VCO frequency and the effect of the output from pin 10 of PLL 82 through resistor 190 to pin 5 of amplifier 110 is to provide a rate of VCO adjustment for higher frequencies which is very rapid and reliable. However, at low frequencies the output at pin 10 of PLL 82 might be less than 1 volt and insufficient to overcome the semi-conductor drops within amplifier 110, or at best would provide extremely slow response. As explained hereinafter, the use of the operational amplifier 110 and pulse phase detector circuit greatly enhances this low frequency response and expands the low speed range of the equipment to under one mph. This circuit in part provides the unusual stable operation of the instant system over a range of 15 Hz to over 6000 Hz.

As described above, phase pulse output 1 of PLL 82 at the VCO frequency is applied to pin 5 (the data input) of the D type flip-flop forming a part of the pulse phase detector 122. The clock input to pin 3 of detector 122 is from pin 5 of divider 104 and this is at twice the signal frequency. This is shown in curve 3(e) and corresponds to the output at conductor 38 which is shown in curve 3(g). The data signal on pin 5 is passed to Q output 1 of detector 122 for each positive going leading edge of the clock input at pin 3. A typical phase pulse signal at locked or near locked operation is shown in curve 3(h). Thus, if the phase pulse signal at pin 1 of PLL is 0 in non-synchronous operation for more than half the output cycle this will be present at Q pin 1 and will thus switch off transistor 194 through resistor 192 and prevent verification. Conversely, a + signal at Q pin 1 of flip-flop 122 is applied through resistor 192 to transistor switch 194 turning switch 194 on and putting the verify output 60 at or near ground. This constitutes a verification signal which permits the counter board 40 to accumulate data and readout on the digital display.

Also out of pulse phase detector 122 a signal of opposite polarity is taken at $\overline{Q}$ pin 2 and applied through conductor 128 to gate 196 and through diode 202 and resistor 204 to point 189. When pin 1 is low showing no verification, pin 2 is high and this signal is applied to the control pin C of bidirectional gate 196 turning on gate 196 to place resistor 198 in parallel with resistor 190. When pin 2 if detector 122 goes to + + this also places resistor 204 (typically 100 K ohms) in parallel with resistor 200 (1 Meg ohm) to raise the potential at point 189. This supplements sense current from pin 10 of PLL 82 and enhancing large error correction or correction at low frequencies. This auxillary circuit provides rapid searching for the input frequency during an initial search phase and removing the supplementary signal when the input and synthetic signals are within plus or minus 90° so that the phase locked loop can more slowly but with precision lock to the signal phase as indicated by outputs 1, 10 and 13 of PLL 82 and insure faster optimum initial acquisition of the signal, but high gain precise operation in the locked mode.

For very low speeds (under a few mph) a 10 K ohm resistor is used at pin 11 of PLL 82 but resistor 204 which is 1 Meg ohm for normal high speed use, is omitted.

What is claimed is:

1. Apparatus for determining the frequency of an unknown periodic input signal which is in a range including a plurality of harmonics of the lowest frequency in the range and may be accompanied by noise comprising: source means providing a periodic output signal of variable frequency, said source means being adapted for locked operation at a sample frequency which is a predetermined multiple of said input signal whereby said periodic output signal is adjustable to match said input signal; frequency and phase comparator means responsive to said output signal and said input signal and generating a control signal which is applied to said source means to control the frequency thereof; and input means applying said input signal to said comparator and including tunable band pass filter means tunable over said range and by-pass means in parallel with said tunable band pass filter means applying a portion of said input signal to said comparator by-passing said tunable band pass filter means.

2. The apparatus of claim 1 wherein said source means is a voltage controlled oscillator.

3. The apparatus of claim 2 wherein said band pass filter is tuned in accordance with said output signal.

4. The apparatus of claim 3 wherein said band pass filter has a Q in excess of about 15.

5. The apparatus of claim 1 wherein said comparator also generates a verification signal output which indicates phasic coincidence of said signals and enabling means responsive to said verification signal output enabling rejection of said output signal information when said signals are not in coincidence.

6. The apparatus of claim 4 wherein the signal applied from said input to said comparator means through said by-pass means is sufficient over said entire range to adjust the frequency of said source means toward the frequency of said input signal.

7. The apparatus of claim 1 including adjustment means to adjust the relative gains of said by-pass means and band pass filter means to provide a dominant signal through said band pass filter to said comparator means whenever said sample frequency is related to said signal frequency by a multiplier of less than about 2.

8. The apparatus of claim 1 including feedback means providing a non-linear control signal to said source means from said comparator to produce an enhanced rate of frequency change of said source means for large phasic differences between said input signal and said sample signal.

9. The apparatus of claim 1 including output means coupled to said source means and means responsive to said comparator means disabling said output means whenever the phase of said periodic output signal differs from said input signal by about 90° or more.

10. In doppler radar apparatus for determining the speed of a vehicle, the combination comprising:
input means for providing a period input signal having a frequency related to the speed of such vehicle;
source means for generating a synthetic signal corresponding on phase and frequency to said input signal, said source means being variable over a range including a plurality of harmonics of the lowest frequency in said range;
phase and frequency comparator means responsive to said input signal and said synthetic signal to generate a control signal to control said source means and to adjust the synthetic signal to have a predetermined phase and frequency relative to said input signal;
digital counter and display means energized from said source means to generate and display a count related to the frequency of said source means;
and timer means controlling a counting interval of said digital counter and display means whereby the count during said interval represents the speed of said vehicle, said input means including tunable band pass filter means having a center frequency tunable over said range and by pass means in parallel with said tunable band pass filter means applying a portion of said input signal to said comparator by-passing said tunable band pass filter means.

11. The doppler radar apparatus of claim 10 wherein said comparator generates a verification signal in response to phase coincidence of said input and synthetic signals, said verification signal being applied to said counter and display means to prevent display of spurious speed information when said signals are not in coincidence.

12. The doppler radar of claim 10 including control means receiving a signal from said source means corresponding to the frequency of said synthetic signal and applying a control signal related thereto to said tunable filter means to control the center frequency of said filter means.

13. The doppler radar of claim 10 including feedback means non-linearly responsive to the phase of said synthetic signal relative to said input signal to increase the rate of correction of said source means by said comparator means for large phase differences.

14. The doppler radar of claim 12 wherein said band pass filter has a Q in excess of about 15 and said by-pass means produces sufficient signal to enable said comparator means for all frequencies of said synthetic signal within said range which are outside of the response band of said filter at any given time.

15. The apparatus of claim 14 wherein said control means includes a monostable multivibrator providing signal pulses of constant duration to control said band pass filter, the number of pulses per unit of time being controlled by the frequency of said synthetic signal.

16. The apparatus of claim 11 wherein said verification signal senses a single cycle of noncoincidence between said input and said synthetic signal to prevent said spurious display.

17. The apparatus of claim 1 including an operational amplifier which receives an input signal from said comparator means and provides the control signal to said source means, and means responsive to said comparator to augment said control signal for periodic output signals at the low end of said range.

18. The apparatus of claim 10 including an operational amplifier which receives an input signal from said comparator means and provides the control signal for said source means, and means responsive to augment said control signal for synthetic signals at the low end of said range.

* * * * *

UNITED STATES PATENT AND TRADEMARK OFFICE
CERTIFICATE OF CORRECTION

PATENT NO. : 4,052,722
DATED : October 4, 1977
INVENTOR(S) : Keith Millard

It is certified that error appears in the above-identified patent and that said Letters Patent are hereby corrected as shown below:

Col. 1, line 20, should read -- $F_d = \frac{2v \, f_t}{c}$

Col. 3, line 31, after "circuit" add --in counter--

Col. 5, line 22, after "for the" add --seven--

Col. 5, line 47, delete "s" in "segments" to make it singular.

Col. 7, line 13, change "by" to --be--

Col. 7, line 35, change "stages" to --states--

Col. 8, line 18, "CO4013" should be --CD4013--

Col. 11, line 44, "if" should be --of--

Col. 12, line 54, "on" should be --in--

Col. 14, line 25 after "responsive" add --to said comparator--

Signed and Sealed this

Fourteenth Day of February 1978

[SEAL]

Attest:

RUTH C. MASON
*Attesting Officer*

LUTRELLE F. PARKER
*Acting Commissioner of Patents and Trademarks*